United States Patent
Lin et al.

(10) Patent No.: US 7,394,714 B2
(45) Date of Patent: Jul. 1, 2008

(54) CIRCUIT IMPLEMENTATION OF A DYNAMIC POWER SUPPLY FOR SRAM CORE ARRAY

(75) Inventors: Wesley Lin, Jhubei (TW); Jhon-Jhy Liaw, Hsin-Chu (TW); Fang-Shi Jordan Lai, Tainan (TW); Chia-Fu Lee, Houbi Township, Tainan County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 35 days.

(21) Appl. No.: 11/516,994

(22) Filed: Sep. 7, 2006

(65) Prior Publication Data

US 2008/0062802 A1    Mar. 13, 2008

(51) Int. Cl.
*G11C 7/00*    (2006.01)
(52) U.S. Cl. .................. 365/227; 365/189.09; 365/229; 365/154

(58) Field of Classification Search ................. 365/154, 365/189.09, 226, 189.11, 189.05, 227, 229, 365/207
See application file for complete search history.

(56) References Cited

U.S. PATENT DOCUMENTS

| 6,724,648 | B2* | 4/2004 | Khellah et al. | 365/154 |
| 7,092,280 | B2* | 8/2006 | Joshi | 365/154 |

* cited by examiner

*Primary Examiner*—David Lam
(74) *Attorney, Agent, or Firm*—Kirkpatrick & Lockhart; Preston Gates Ellis LLP

(57) ABSTRACT

A SRAM device includes at least one memory cell having a source line for receiving an internal supply power, and a voltage management circuit coupled to the source line for generating the internal supply power that varies in at least two different voltage levels, depending on various operation modes of the memory cell.

19 Claims, 6 Drawing Sheets

CIRCUIT IMPLEMENTATION OF A DYNAMIC POWER SUPPLY FOR SRAM CORE ARRAY

BACKGROUND

The present invention relates generally to static random access memories (SRAM), and more particularly to a circuit implementation for providing various voltages to an SRAM core array, depending on the mode of operation.

SRAM devices are used in a wide variety of applications. SRAM devices provide one or more randomly accessible memory array where the data contents can be written and re-written at any time. FIG. 1 shows a schematic of a conventional SRAM cell 100 that includes six transistors. A cross-coupled inverter pair, which is constructed by transistors 102, 104, 106, 108, and access transistors 110, 112 make up the SRAM cell 100. A supply voltage VCC powers the SRAM cell 100. The SRAM periphery power supply voltage (VDD) powers the word line (WL), bit line (BL) and complementary bit line (BLB). During write operation, a write data state is set by forcing complimentary voltages (0 and 1) on the BL and BLB, and forcing a high signal on WL to turn on the access transistors 110 and 112. This allows the data state to be forced into the cross-coupled inverter pair. The access transistors 110 and 112 are then turned off. The positive feedback of the cross-coupled inverter pair will ensure that the new data state is maintained. Typically, a plurality of memory cells is implemented on the SRAM device to form a large array of SRAM memory cells 100 powered by one supply voltage.

As the process used for semiconductor manufacturing moves towards the 0.13 um generation, the design rules continue to shrink for high density and high performance SRAM devices. As a result, the supply voltage VCC, of these devices must be reduced to below 1.0V. However, as the supply voltage VCC is reduced to below 1.0V, static noise margin (SNM) gets adversely affected, thereby leading to cell instability. SNM is defined as the minimum noise voltage at the cell storage nodes that is needed to flip the state of the cell. One method to improve SNM is by increasing the beta-ratio ($\beta$) of the SRAM cell. Beta-ratio ($\beta$) is the ratio of the width of the pull-down transistor to the access transistor. Increasing "beta-ratio" results in larger cell size of SRAM and hence is not desirable. Another method to improve SNM is by increasing the voltage supplied to the SRAM core array. Increasing the voltage supplied to the SRAM core array improves the SNM during read operation, but has an adverse effect on the write margin (WTM) during the write operation. While using two power supplies producing two different voltages, one for read and another for write operation, can improve both SNM and WTM, it makes the SRAM design more complex.

As such, what is needed is a single dynamic power supply for an SRAM core array that can provide multiple voltages during multiple operation modes such that the SNM and WTM issues can be addressed.

SUMMARY

The present invention discloses a static random access memory (SRAM) device. In one embodiment of the invention, the SRAM device includes at least one memory cell having a source line for receiving an internal supply power, and a voltage management circuit coupled to the source line for generating the internal supply power that varies in at least two different voltage levels, depending on various operation modes of the memory cell.

The construction and method of operation of the invention, however, together with additional objectives and advantages thereof will be best understood from the following description of specific embodiments when read in connection with the accompanying drawings.

DESCRIPTION

Figure 1:
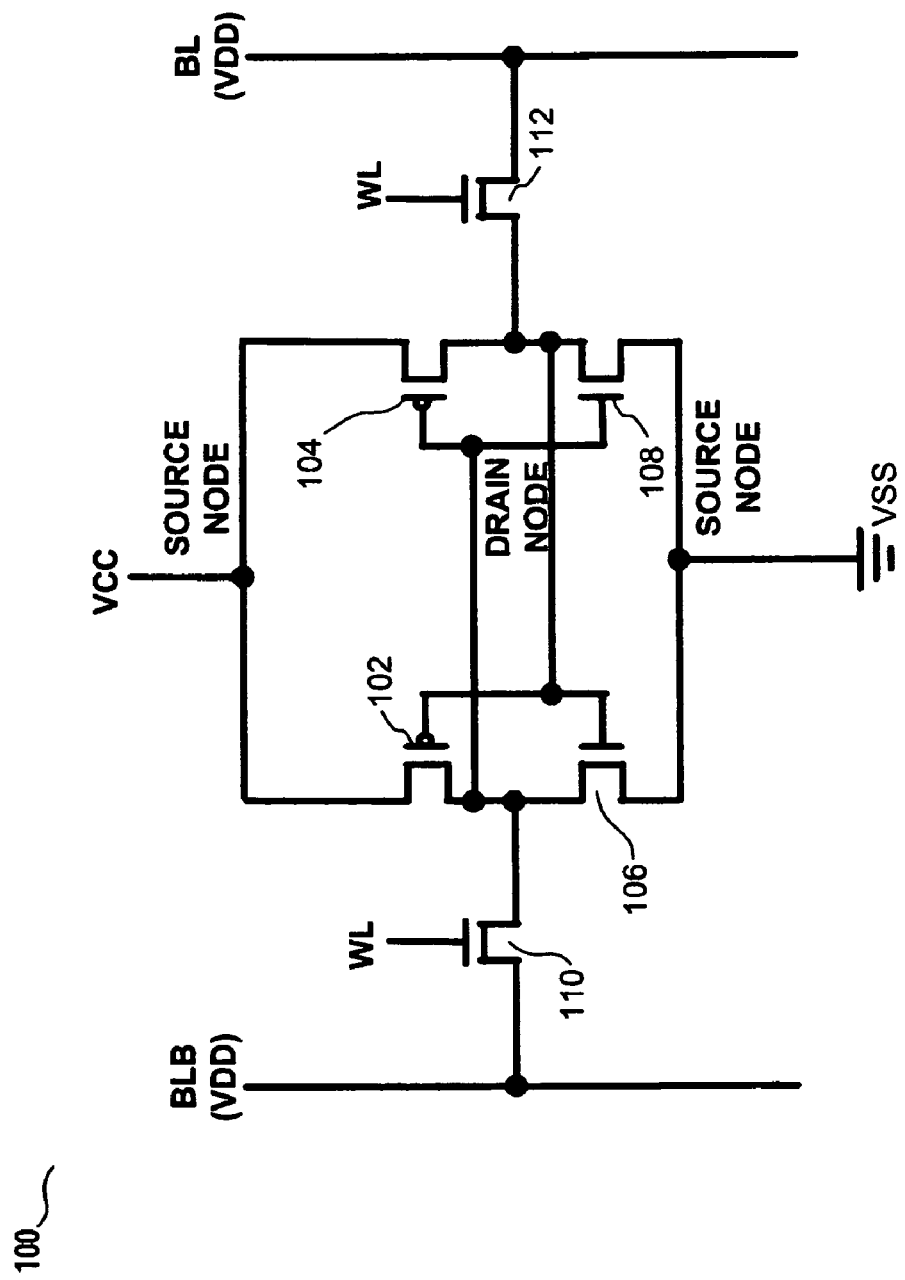
FIG. 1 schematically illustrates a SRAM cell with six transistors.
Figure 2:
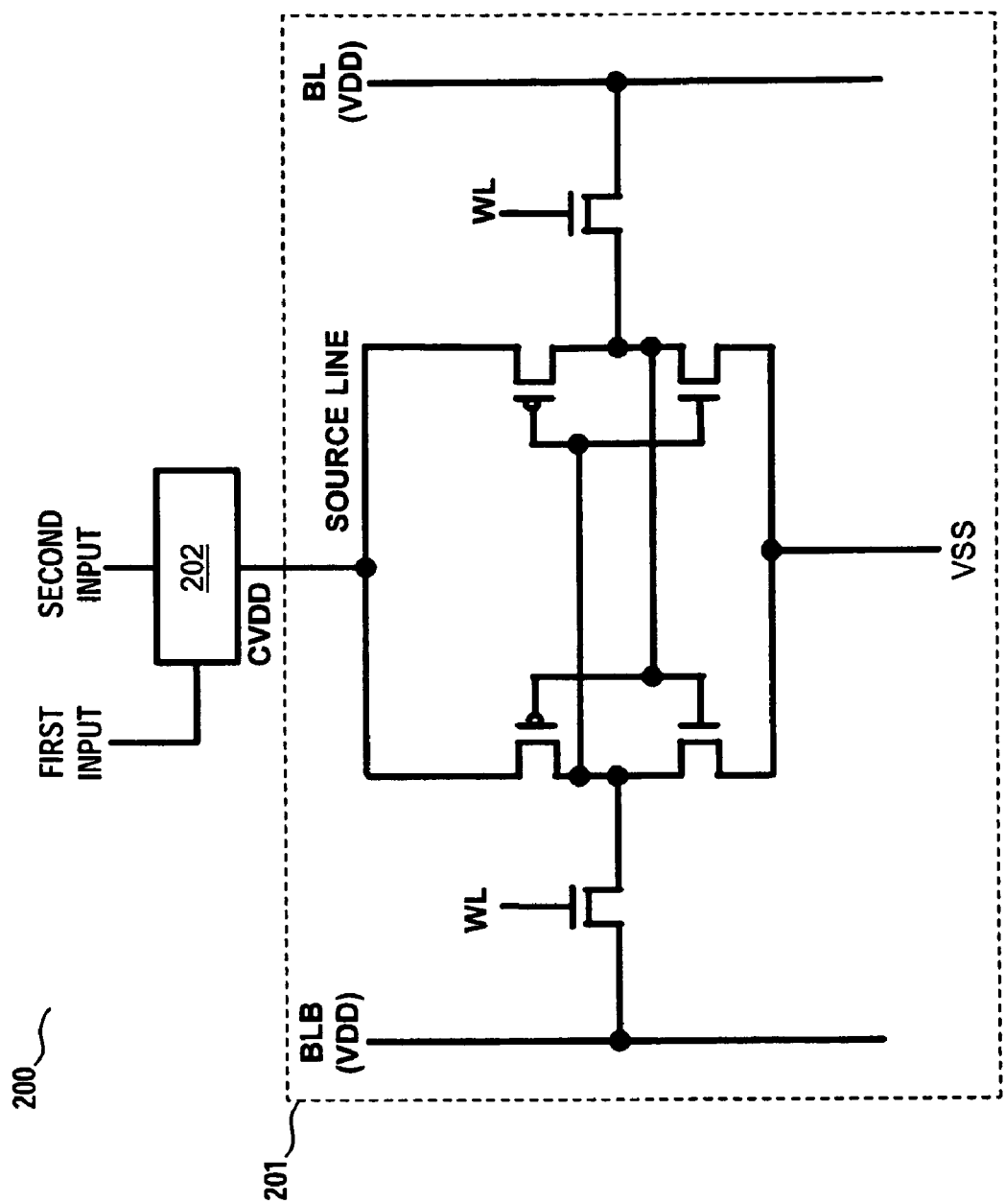
FIG. 2 schematically illustrates a voltage management circuit for an SRAM cell in accordance with one embodiment of the present invention.

FIG. 2 schematically illustrates a circuit 200 for an SRAM cell 201 using a voltage management circuit 202 in accordance with one embodiment of the present invention. The voltage management circuit 202 has two input terminals. The first input terminal receives a mode control signal and the second input terminal is coupled to a power supply line. The output of voltage management circuit 202 is the SRAM core array power supply voltage (CVDD) that is connected to the source line of the SRAM cell 201. CVDD is a fixed set of voltages each corresponding to various operation modes of SRAM cell 201. The various modes of operation can be at least two of the selected operation modes, such as read, write, stand-by, sleep and power-down modes. Output voltage CVDD of the voltage management circuit 202 is higher than VDD during read operation and lower than VDD during write operation. The output voltage CVDD is also much lower than VDD when the SRAM cell 201 is in stand-by, sleep and power-down modes to save power.

Figure 3:
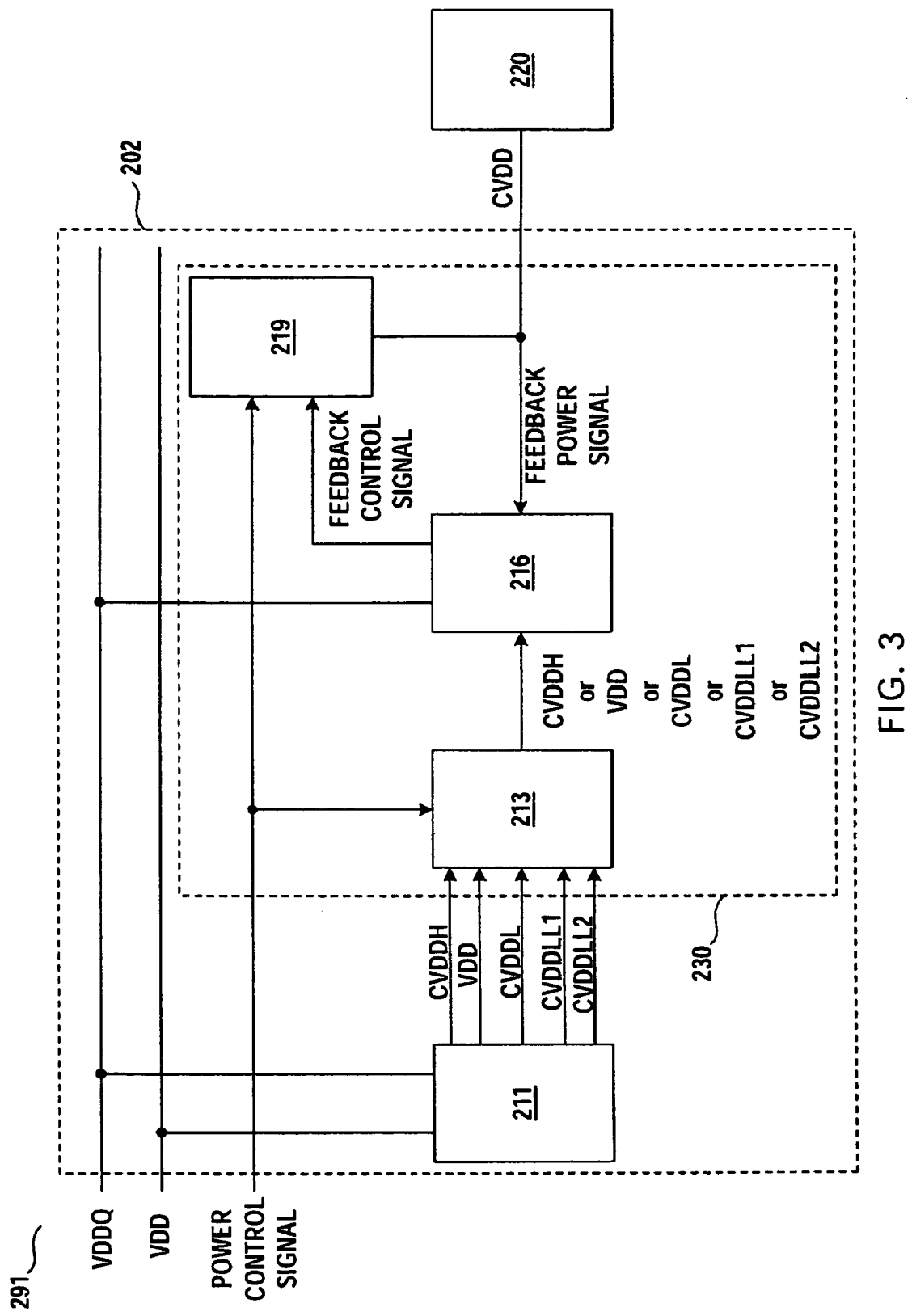
FIG. 3 illustrates a function block diagram of the voltage management circuit in accordance with one embodiment of the present invention.

FIG. 3 illustrates a function block diagram 291 of a SRAM device in accordance with one embodiment of the present invention. The function block diagram 291 contains an SRAM array 220, which includes one or more SRAM cells, and a voltage management circuit 202. There are two external sources of power and one internally generated power. One of the external sources of power is the I/O power and it supplies I/O voltage VDDQ that can have a value such as 3.3 volts, 2.5 volts or 1.8 volts. The other external source of power, supplies a constant periphery voltage (VDD). The voltage management circuit 202 generates the different CVDD voltages. The voltage management circuit 202 includes a main voltage generator 211 and a voltage converter 230. The main voltage generator 211 includes a band gap reference or a voltage divider to generate stable reference voltages. The voltage converter 230 includes a reference voltage selector 213, a differential amplifier based voltage follower 216 and power control module 219.

The main voltage generator 211 receives the two external voltages VDDQ & VDD as inputs and generates the various CVDD voltages. The main voltage generator 211 down converts the external voltage VDQQ to generate various reference voltages equal to VDD multiplied by various ratios. For example, the resulting CVDD voltages generated by the main voltage generator 211 are CVDDH that is 1.2 times VDD, CVDDL that is 0.8 times VDD, CVDDLL1 that is 0.6 times VDD and CVDDLL2 that is 0.5 times VDD.

The reference voltage selector 213 selects one of these reference voltages in response to the power control signal. The power control signal can be a read/write control signal, word-line (row) decoder signal, bit-line (column) decoder signal or externally forced signal. The differential amplifier based voltage follower 216 includes two or more negative feedback differential amplifiers for generating a feedback control signal to the power control module 219 in order to maintain the output signals of the reference voltage selector 213 and the power control module 219 at the same level. The power control module 219 can be a single MOS device, combined PMOS and NMOS devices, or a single MOS device coupled with a push-pull device. The power control module 219 modulates the CVDD voltage level in response to the output of the differential amplifier based voltage follower 216. Thus the voltage management circuit 202 is able to generate CVDDH, VDD, CVDDL, CVDDLL1, or CVDDLL2 as shown in Table 1, in response to the operation mode of the SRAM core array 220.

ies, depending on the operation mode in accordance with one embodiment of the present invention. The SRAM core array 220 includes a plurality of SRAM cells 201, each of which includes a wordline, a bit line; a complementary bit line, a ground line and a source line. The voltage management device 202 is configured to apply a set voltage CVDD to the source lines of the memory array 220 depending on the operation mode.

Figure 5:
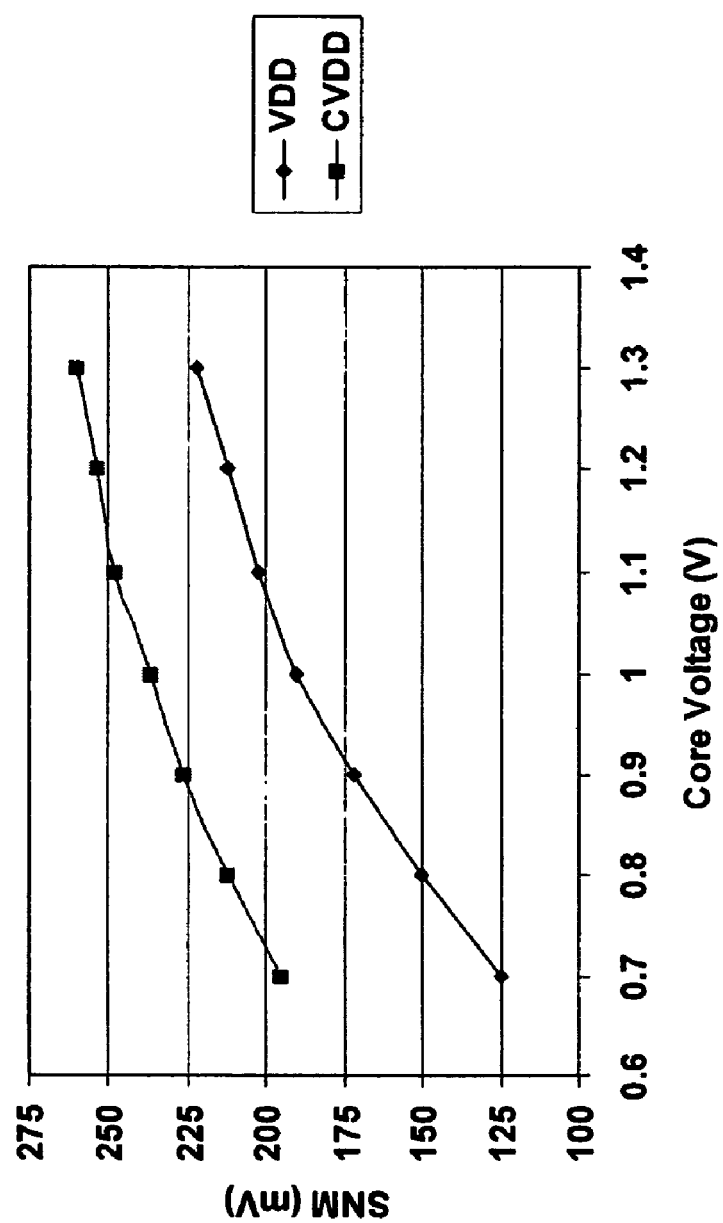
FIG. 5 graphically illustrates the SNM improvement of the SRAM cell with the proposed voltage management circuit in accordance with one embodiment of the present invention.

The SNM improvement of the present invention is graphically illustrated in FIG. 5. There is a substantial improvement in SNM when CVDD is boosted by 10% (=CVDDH) compared to when the CVDD is the same as VDD.

Figure 6:
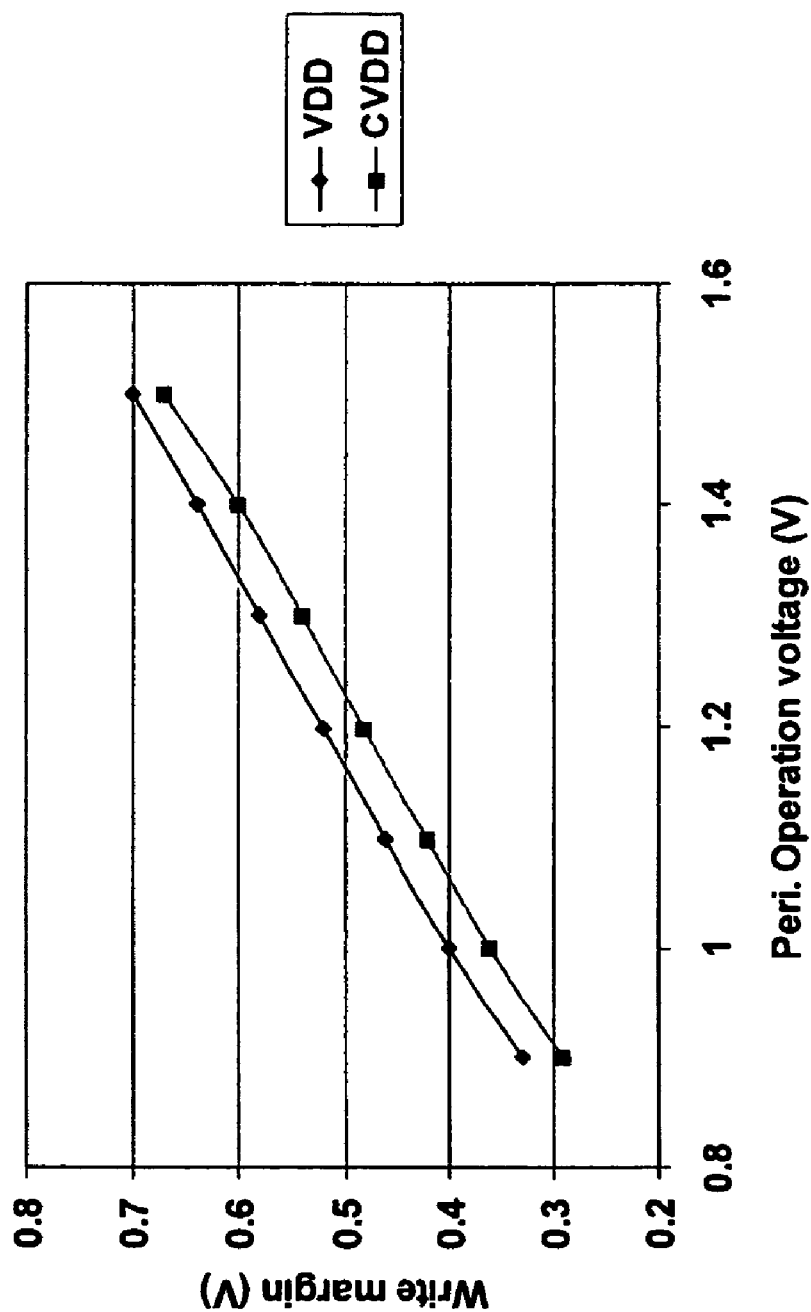
FIG. 6 graphically illustrates the WTM improvement of the SRAM cell with the proposed voltage management circuit in accordance with one embodiment of the present invention.

The WTM improvement of the present invention is graphically illustrated in FIG. 6. There is a substantial improvement in WTM when CVDD is reduced by 10% (=CVDDL) compared to when the CVDD is the same as VDD.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since

TABLE 1

| Output | Active | | | Inactive | |
|---|---|---|---|---|---|
| | Read (WL on) | Write (WL on) | Standby (WL off) | Sleep | Power-Down |
| CVDDH | 1.2 * VDD | — | — | — | — |
| CVDD | — | — | 1.0 * VDD | — | — |
| CVDDL | — | 0.8 * VDD | — | — | — |
| CVDDLL1 | — | — | — | 0.6 * VDD | — |
| CVDDLL2 | — | — | — | — | 0.5 * VDD |

The proposed embodiment of the present invention supplies different voltages during various modes of operation. When the SRAM is in a normal or read mode, the voltage management circuit 202 supplies the SRAM core array 220 with a voltage (CVDDH) that is always higher than SRAM periphery power supply voltage (VDD). A higher voltage makes the write operation (both accidental and intentional) very difficult, thereby improving the SNM. This, in turn, improves the stability of SRAM cell during the read operation.

The proposed embodiment of the present invention also improves the WTM. An objective of the write operation is to apply voltage to the SRAM cell that will cause its state to flip. A higher voltage makes the write operation more difficult. When the SRAM is in a write mode, the voltage management circuit 202 supplies the SRAM core array 220 with a voltage (CVDDL) that is lower than the SRAM periphery power supply (VDD), thereby resulting in an improved WTM.

The proposed embodiment of the present invention supplies a voltage VDD to SRAM core array 220 when the SRAM is in a pre-charge or standby mode, and supplies a low voltage CVDDLL1 or CVDDLL2 to the SRAM core array 220 when the SRAM is in a power-down or sleep mode. Optimizing CVDD to supply higher voltage only when required and a lower voltage that is a fraction of the VDD at other times saves power.

Figure 4:
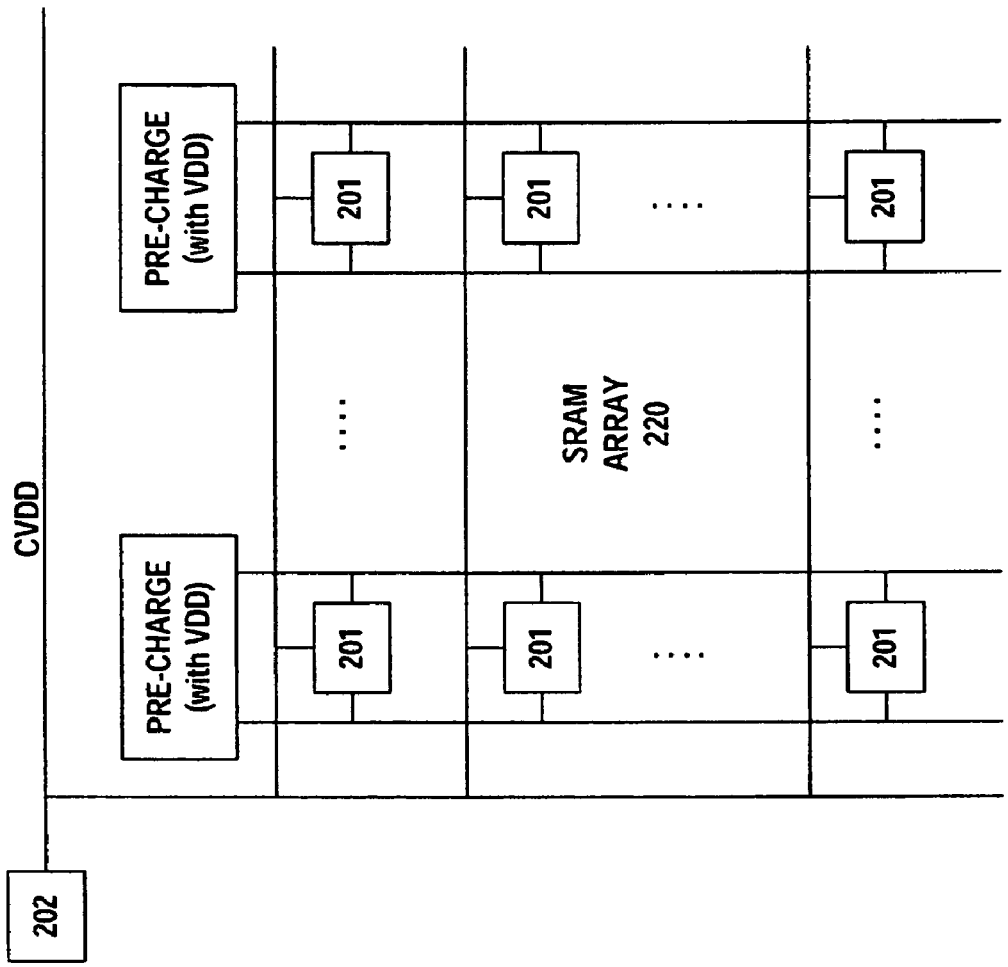
FIG. 4 illustrates an SRAM array wherein the level of supply voltage varies dynamically depending on the operation modes in accordance with one embodiment of the present invention.

FIG. 4 schematically illustrates a circuit wherein the CVDD level of an entire SRAM array 220 dynamically varvarious modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) device comprising:
    at least one memory cell having a source line for receiving an internal supply power; and
    a voltage management circuit coupled to the source line for generating the internal supply power that varies in at least two different voltage levels,
    wherein the voltage management circuit comprises a voltage generator that simultaneously generates a periphery power supply voltage that powers bit lines of the memory cell, a first voltage that is higher than the periphery power supply voltage, a second voltage that is lower than the first voltage, and a third voltage that is lower than the second voltage depending on various operation modes of the memory cell.

2. The SRAM device of claim 1, wherein the voltage management circuit comprises a first input terminal for receiving a power control signal indicating the operation mode of the memory cell, and a second input terminal for receiving an external supply power.

3. The SRAM device of claim 2, wherein the operation mode comprises read, write, stand-by, sleep or power down modes.

4. The SRAM device of claim 3, wherein the internal supply power is at a first voltage level that is higher than a periphery power supply voltage on a bit line of the memory cell, when the memory cell is in the read mode.

5. The SRAM device of claim 4, wherein the internal supply power is at a second voltage level that is lower than the periphery power supply voltage, when the memory cell is in the write mode.

6. The SRAM device of claim 5, wherein the internal supply power is at a third voltage level that is lower than the second voltage level, when the memory cell is in the stand-by, sleep or power-down mode.

7. The SRAM device of claim 6, wherein the voltage management circuit comprises a voltage generator that receives the external supply power and the periphery power supply voltage for simultaneously outputting the periphery power supply voltage, a first output at the first voltage level, a second output at the second voltage level, and a third output at the third voltage level.

8. The SRAM device of claim 7, wherein the voltage management circuit comprises a voltage converter coupled to the voltage generator for selectively outputting the periphery power supply voltage, the first output, the second output or the third output, in response to the power control signal.

9. The SRAM device of claim 8, wherein the voltage management circuit comprises:
 a differential amplifier based voltage follower coupled to the voltage converter for generating a feedback control signal; and
 a power control module for generating the internal supply power to the memory cell and the differential amplifier based voltage follower in response to the feedback control signal and the power control signal,
 wherein the differential amplifier based voltage follower adjusts the feedback control signal in order to maintain the internal supply power and the output of the voltage converter at the same voltage level.

10. A static random access memory (SRAM) device comprising:
 at least one memory cell having a source line for receiving an internal supply power; and
 a voltage management circuit coupled to the source line for generating the internal supply power that varies in at least two different voltage levels, depending on various operation modes of the memory cell,
 wherein the internal supply power is at a first voltage level that is higher than a periphery power supply voltage on a bit-line of the memory cell when the memory cell is in a read mode, and at a second voltage level that is lower than the periphery power supply voltage when the memory cell is in a write mode, and the internal supply power is at a third voltage level that is lower than the second voltage level when the memory cell is in a stand-by, sleep or power-down mode.

11. The SRAM device of claim 10, wherein the voltage management circuit comprises a first input terminal for receiving a power control signal indicating the operation mode of the memory cell, and a second input terminal for receiving an external supply power.

12. The SRAM device of claim 11, wherein the voltage management circuit comprises a voltage generator that receives the external supply power and the periphery power supply voltage for simultaneously outputting the periphery power supply voltage, a first output at the first voltage level, a second output at the second voltage level, and a third output at the third voltage level.

13. The SRAM device of claim 12, wherein the voltage management circuit comprises a voltage converter coupled to the voltage generator for selectively outputting the periphery power supply voltage, the first output, the second output or the third output, in response to the power control signal.

14. The SRAM device of claim 13, wherein the voltage management circuit comprises:
 a differential amplifier based voltage follower coupled to the voltage converter for generating a feedback control signal; and
 a power control module for generating the internal supply power to the memory cell and the differential amplifier based voltage follower in response to the feedback control signal and the power control signal,
 wherein the differential amplifier based voltage follower adjusts the feedback control signal in order to maintain the internal supply power and the output of the voltage convert at the same voltage level.

15. A static random access memory (SRAM) device comprising:
 at least one memory cell having a source line for receiving an internal supply power; and
 a voltage management circuit coupled to the source line for generating the internal supply power that varies in at least two different voltage levels, depending on various operation modes of the memory cell,
 wherein the internal supply power is at a first voltage level that is higher than a periphery power supply voltage on a bit line of the memory cell when the memory cell is in a read mode, at a second voltage level that is lower than the periphery power supply voltage when the memory cell is in a write mode, and at a third voltage level that is lower than the second voltage level when the memory cell is in a stand-by, sleep or power-down mode.

16. The SRAM device of claim 15, wherein the voltage management circuit comprises a first input terminal for receiving a power control signal indicating the operation mode of the memory cell, and a second input terminal for receiving an external supply power.

17. The SRAM device of claim 16, wherein the voltage management circuit comprises a voltage generator that receives the external supply power and the periphery power supply voltage for simultaneously outputting the periphery power supply voltage, a first output at the first voltage level, a second output at the second voltage level, and a third output at the third voltage level.

18. The SRAM device of claim 17, wherein the voltage management circuit comprises a voltage converter coupled to the voltage generator for selectively outputting the periphery power supply voltage, the first output, the second output or the third output, in response to the power control signal.

19. The SRAM device of claim 18, wherein the voltage management circuit comprises:
 a differential amplifier based voltage follower coupled to the voltage converter for generating a feedback control signal; and
 a power control module for generating the internal supply power to the memory cell and the differential amplifier based voltage follower in response to the feedback control signal and the power control signal,
 wherein the differential amplifier based voltage follower adjusts the feedback control signal in order to maintain the internal supply power and the output of the voltage converter at the same voltage level.

* * * * *